United States Patent
Kim et al.

(10) Patent No.: US 7,135,716 B2
(45) Date of Patent: Nov. 14, 2006

(54) GALLIUM NITRIDE-BASED SEMICONDUCTOR LIGHT-EMITTING DEVICE

(75) Inventors: Je Won Kim, Seoul (KR); Jeong Tak Oh, Kyungki-do (KR); Dong Joon Kim, Seoul (KR); Sun Woon Kim, Kyungki-do (KR); Soo Min Lee, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/911,562

(22) Filed: Aug. 5, 2004

(65) Prior Publication Data
US 2005/0224824 A1   Oct. 13, 2005

(30) Foreign Application Priority Data
Mar. 31, 2004  (KR) ............... 10-2004-0021905

(51) Int. Cl.
*H01L 29/22* (2006.01)
(52) U.S. Cl. ............ 257/103; 257/94; 257/96; 257/101; 257/102; 257/190
(58) Field of Classification Search ........... 257/94, 257/96, 101–103, 190, E21.395; 438/22, 438/46, 47
See application file for complete search history.

(56) References Cited

U.S. PATENT DOCUMENTS

| | | | | |
|---|---|---|---|---|
| 5,633,192 A | * | 5/1997 | Moustakas et al. | 438/46 |
| 5,793,061 A | * | 8/1998 | Ohuchi et al. | 257/96 |
| 6,005,258 A | * | 12/1999 | Manabe et al. | 257/13 |
| 6,147,364 A | * | 11/2000 | Itaya et al. | 257/76 |
| 6,462,357 B1 | * | 10/2002 | Tsai et al. | 257/97 |
| 6,593,016 B1 | * | 7/2003 | Chiyo et al. | 428/698 |
| 6,610,144 B1 | * | 8/2003 | Mishra et al. | 117/95 |
| 6,657,300 B1 | * | 12/2003 | Goetz et al. | 257/745 |
| 6,855,959 B1 | * | 2/2005 | Yamaguchi et al. | 257/98 |
| 2002/0163008 A1 | * | 11/2002 | Northrup et al. | 257/102 |
| 2004/0079947 A1 | * | 4/2004 | Lan et al. | 257/79 |
| 2004/0137657 A1 | * | 7/2004 | Dmitriev et al. | 438/47 |
| 2005/0017261 A1 | * | 1/2005 | Ishizaki | 257/103 |

OTHER PUBLICATIONS

"Control of the polarity of GaN films using an Mg adsorption layer", Journal of Crystal Growth vol. 251 460-464 (Apr. 2003).
"Polarity control in MBE growth of III-nitrides, and its device application", Current Applied Physics vol. 2 305-310 (Aug. 2002).

* cited by examiner

*Primary Examiner*—Eugene Lee
(74) *Attorney, Agent, or Firm*—Lowe Hauptman & Berner, LLP.

(57) ABSTRACT

A gallium nitride-based semiconductor light-emitting device includes a sapphire substrate having a nitridated upper surface; a polarity conversion layer formed on the sapphire substrate and made of MgN-based single crystals; a first conductive gallium nitride-based semiconductor layer formed on the polarity conversion layer; an active layer formed on the first conductive gallium nitride-based semiconductor layer; and a second conductive gallium nitride-based semiconductor layer formed on the active layer.

10 Claims, 3 Drawing Sheets

(before etching)

(10 minutes after etching)

(before etching)

(10 minutes after etching)

GALLIUM NITRIDE-BASED SEMICONDUCTOR LIGHT-EMITTING DEVICE

RELATED APPLICATIONS

The present application is based on, and claims priority from, Republic of Korea Application Ser. No. 2004-21905, filed Mar. 31, 2004, the disclosure of which is hereby incorporated by reference herein in its entirety.

BACKGROUND OF THE INVENTION

1. Field of the Invention

The present invention relates to a gallium nitride-based semiconductor light-emitting device, and more particularly to a gallium nitride-based semiconductor light-emitting device with an improved crystallinity of a gallium nitride-based semiconductor.

2. Description of the Related Art

Generally, a gallium nitride-based semiconductor light-emitting device is a light-emitting device used for obtaining light with a blue or green wavelength, and is made of a semiconductor material having a composition formula of $Al_xIn_yGa_{(1-x-y)}N$ wherein $0 \leq x,y,x+y \leq 1$. A gallium nitride-based semiconductor crystal layer (hereinafter, referred to as a gallium nitride-based semiconductor layer) may be grown on an heterologous substrate such as a sapphire ($\alpha$—$Al_2O_3$) substrate or SiC substrate. Especially, the sapphire substrate has the same hexagonal structure as gallium nitride, and is primarily used as it is inexpensive and stable at higher temperature, as compared to a SiC substrate.

However, the sapphire substrate also has disadvantages such as a lattice constant difference of about 13% and further a large difference of thermal expansion coefficient (about −34%) from gallium nitride and thus suffers from strain occurring at the interface between the sapphire substrate and gallium nitride single crystals, thereby giving rise to lattice defects and cracks in crystals.

One of conventional strategies to overcome these problems and obtain better single crystals is a heteroepitaxy method involving formation of a buffer layer on the sapphire substrate. A low temperature nucleus-growth layer made of material such as $Al_xGa_{1-x}N$ is primarily used as the buffer layer. However, since the low temperature nucleus-growth layer is a polycrystal layer, a gallium nitride-based semiconductor layer formed thereon has been known to have a significant density of crystal defects (level of $10^9 \sim 10^{10}/cm^2$). Further, there is required a thermal cleaning process for the sapphire substrate, and processing conditions of growing temperature and thickness of the low temperature nucleus-growth layer are very strict making it difficult to control them within a suitable range, resulting in complex process control and requiring a long processing time.

Alternatively, there is another method involving nitridation of the upper surface of the sapphire substrate followed by growing the gallium nitride-based semiconductor layer. In this method, a gallium nitride-based semiconductor layer with an excellent crystallinity may be grown by improving rough surface conditions of the sapphire substrate to decrease surface energy.

The above-mentioned nitridation is a relatively simple process as compared to the buffer layer technique, but has a significant disadvantage in that it is difficult to grow excellent semiconductor crystals. This defect results from the fact that a gallium nitride-based semiconductor layer grown on a nitridated sapphire surface has a nitrogen-rich surface. This gallium nitride-based semiconductor layer with nitrogen-rich surface has a major polarity appearing in N-polarity (See Japanese Journal of Applied Physics, Vol 36, L73 2000) and materials serving as impurities bind much better to the gallium nitride-based semiconductor layer with an N-polarity surface than to a Ga-polarity surface with a gallium-rich surface. From this, it is known that the gallium nitride-based semiconductor having an N-polarity surface has a decrease in crystallinity as compared to a gallium nitride-based semiconductor layer having a Ga-polarity surface.

Therefore, there remains a need for a process for preparing gallium nitride-based semiconductor light-emitting devices that can employ a crystal film satisfying optimum conditions to grow a high quality semiconductor crystal layer for light-emitting structures in the art.

SUMMARY OF THE INVENTION

Therefore, the present invention has been made in view of the above problems, and it is an object of the present invention to provide a gallium nitride-based semiconductor light-emitting device to which is introduced a polarity conversion layer capable of growing a gallium nitride-based semiconductor layer with a Ga-polarity surface in order to improve crystallinity and surface properties of a gallium nitride-based semiconductor layer.

In accordance with the present invention, the above and other objects can be accomplished by the provision of a gallium nitride-based semiconductor light-emitting device, comprising a sapphire substrate having a nitridated upper surface, a polarity conversion layer formed on the upper surface of the sapphire substrate and made of MgN-based single crystals, a first conductive gallium nitride-based semiconductor layer formed on the polarity conversion layer, an active layer formed on the first conductive gallium nitride-based semiconductor layer, and a second conductive gallium nitride-based semiconductor layer formed on the active layer.

As the polarity conversion layer, material satisfying a composition formula of $(Al_xGa_yIn_z)Mg_{3-(x+y+z)}N_2$ wherein $0 \leq x,y,z \leq 1$, and $0 < x+y+z < 3$ may be used.

As the polarity conversion layer, material satisfying a composition formula of $Si_aMg_{3-a}N_2$ wherein $0 \leq a \leq 1$ may be used.

The polarity conversion layer used in the present invention may be formed by an MBE or MOCVD method.

In addition, the gallium nitride-based semiconductor light-emitting device in accordance with the present invention may further include a buffer layer formed between the sapphire substrate and the polarity conversion layer.

As used herein, the term "polarity conversion layer" means a crystal layer provided so as to have a gallium-rich Ga polarity surface (i.e., upper surface) even under the condition that a gallium nitride-based semiconductor layer to be formed thereon has a nitrogen-rich N polarity surface. The present invention can improve crystallinity and surface properties of a subsequently grown gallium nitride-based semiconductor layer by providing the polarity conversion layer on the nitridation-treated sapphire surface.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
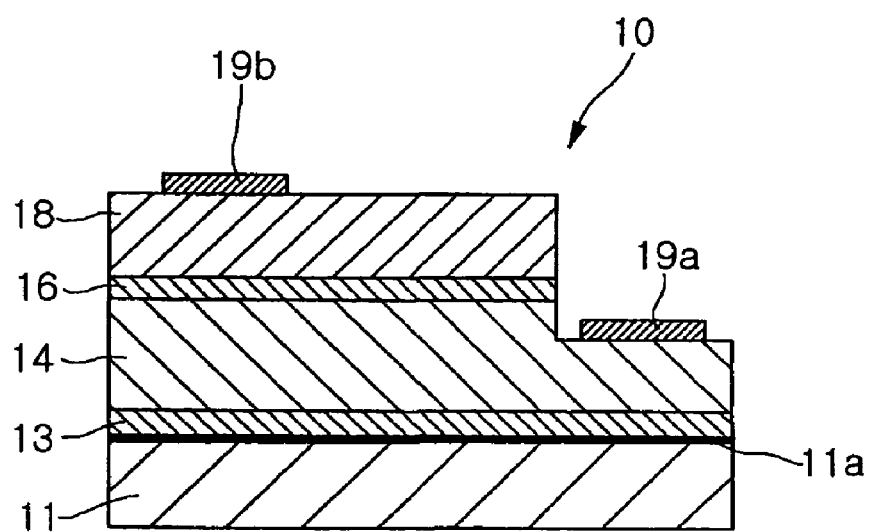
FIG. 1 is a cross-sectional side view of a gallium nitride-based semiconductor light-emitting device according to one embodiment of the present invention.

Preferred embodiments of the present invention will now be described in detail with reference to the annexed drawings. FIG. 1 is a cross-sectional side view of a gallium nitride-based semiconductor light-emitting device according to one embodiment of the present invention.

Referring to FIG. 1, a gallium nitride-based semiconductor light-emitting device 10 includes an MgN-based polarity conversion layer 13 formed on a sapphire substrate 11. A first conductive gallium nitride-based semiconductor layer 14, an undoped active layer 16 and a second conductive gallium nitride-based semiconductor layer 18 are formed sequentially on the polarity conversion layer 13. The gallium nitride-based semiconductor light-emitting device 10 also has a first electrode 19a and a second electrode 19b connected to the first and second conductive gallium nitride-based semiconductor layer 14 and 18, respectively. The active layer 16 may have a multiple quantum well structure in which quantum barrier layers, i.e., GaN layers and quantum well layers, i.e., InGaN layers are stacked alternately.

In accordance with the present invention, the polarity conversion layer 13 is provided on a nitridated surface 11a of the sapphire substrate 11. The surface 11a of the sapphire substrate 11 is nitridated thus containing a large number of nitrogen dangling bondings. A gallium nitride-based semiconductor layer directly grown thereon has a nitrogen-rich N polarity surface as well. The polarity conversion layer 13 formed in this manner will function to convert the surface polarity of a gallium nitride-based semiconductor layer to be grown in a subsequent process in accordance with the present invention.

The polarity conversion layer 13 is made of MgN-based crystals, and Mg therein bonds to the nitrogen dangling bondings on the sapphire substrate surface, thereby a gallium nitride-based semiconductor layer to be grown in the subsequent process may be grown so as to have a Ga polarity surface.

Preferably, as the polarity conversion layer 13 used in the present invention, material satisfying a composition formula of $(Al_xGa_yIn_z)Mg_{3-(x+y+z)}N_2$ wherein $0 \leq x,y,z \leq 1$, and $0 < x+y+z < 3$, or $Si_aMg_{3-a}N_2$ wherein $0 \leq a \leq 1$ may be used. Also, it is preferable that the polarity conversion layer 13 be grown to a thickness of 0.001 to 0.5 μm.

In this manner, in accordance with the present invention, a gallium nitride-based semiconductor layer having a gallium-rich surface can be produced by forming a MgN-based polarity conversion layer on the nitridated sapphire substrate.

This gallium nitride-based semiconductor layer having a gallium-rich Ga polarity surface has a poor ability to bond to materials functioning as impurities, as compared to a nitrogen-rich N surface, and has no hexagonal shape hampering the growth of crystals, thus being capable of forming light-emitting structures made of a gallium nitride-based semiconductor layer having high quality crystallinity.

Figure 4:
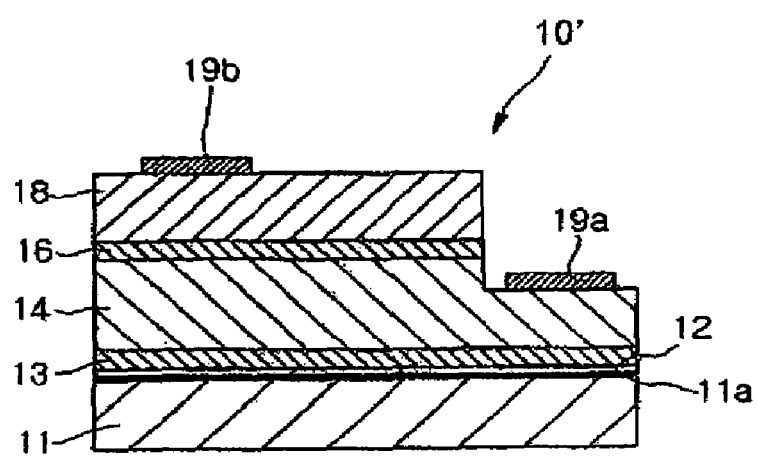
FIG. 4 is a view similar to FIG. 1 showing a further embodiment of the invention.

The light-emitting device (10', FIG. 4) of the present invention may further include another semiconductor layer such as a low temperature nucleus-growth layer formed on the nitridated sapphire substrate as an additional buffer layer (12, FIG. 4). In this embodiment, the MgN-based polarity conversion layer may be provided on the buffer layer, which can change surface polarity of a gallium nitride-based semiconductor layer to be grown in a subsequent process.

EXAMPLE

To confirm the effect of the MgN-based polarity conversion layer used in the present invention, nitridation was carried out on the sapphire substrate.

Then, by using an MOCVD process, an (AlGaN)MgN crystal layer was formed on the nitridated surface of the sapphire substrate as a polarity conversion layer, followed by a GaN layer.

Figure 2A:
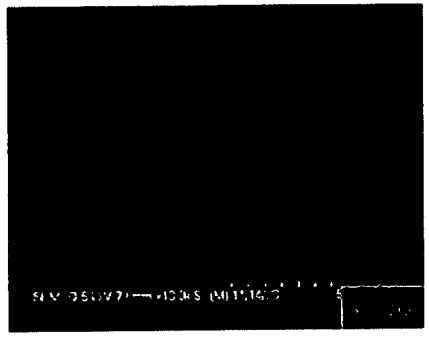
FIGS. 2a and 2b are, respectively, SEM micrographs before and after surface etching of a gallium nitride single crystal layer obtained in one embodiment of the present invention.

FIG. 2a is an SEM micrograph of the surface of a GaN layer formed on the polarity conversion layer, obtained in this example.

To confirm surface polarity of the GaN layer, it was etched with KOH for 10 minutes at 85° C. The resulting surface of the GaN layer is shown in FIG. 2b.

Figure 2B:
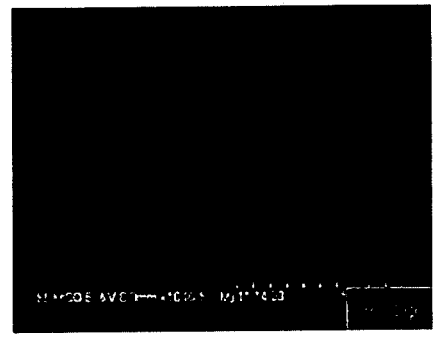

As can be seen from FIG. 2b, there was little change in surface morphology of the GaN layer even after etching. This is because the surface of the GaN layer is rich with gallium having little reactivity to KOH. Thus, it was possible to grow a GaN layer having a desired Ga polarity surface using the MgN-based polarity conversion layer.

COMPARATIVE EXAMPLE

In this Comparative Example, a GaN layer was formed on a sapphire substrate in the same manner as the conventional method. That is, nitridation was performed on a sapphire substrate under the same conditions as in the Example described above, and then a GaN layer was formed directly on the surface thereof by MOCVD.

Figure 3A:
FIGS. 3a and 3b are, respectively, SEM micrographs before and after surface etching of gallium nitride single crystal layer obtained in the prior art.

FIG. 3a is an SEM micrograph of the surface of the GaN layer formed on the nitridated surface of the sapphire substrate, obtained in this example.

Figure 3B:
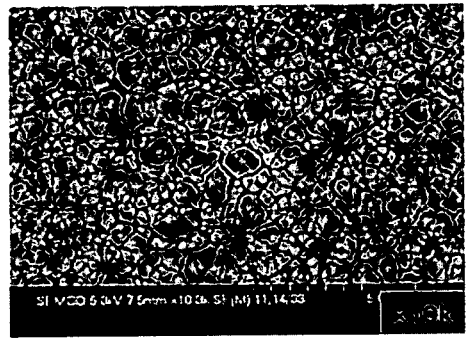

To confirm the surface polarity of the GaN layer, it was etched with KOH for 10 minutes at 85° C., under the same etching conditions as those of the above Example. FIG. 3b shows the resulting surface of the GaN layer.

As shown in FIG. 3b, significant change in surface morphology of the GaN layer obtained in this Comparative Example was observed. More particularly, unlike the surface of the GaN layer formed in the above-mentioned Example, large parts of the GaN layer in this example had been etched by the KOH, showing hexagonal shape thereof. This is because the etched surface of the GaN layer is a nitrogen-rich surface and thus has a high rate of etching in KOH. Therefore, the GaN layer directly formed on the nitridated sapphire substrate without use of a MgN-based polarity conversion layer, was found to be a nitrogen-rich, N polarity surface.

According to the present invention, provision of a MgN-based polarity conversion layer on the nitridated sapphire substrate enables the gallium nitride-based semiconductor layer grown in a subsequent process to have a gallium-rich Ga polarity surface. Such a gallium nitride-based semiconductor layer having a gallium-rich Ga polarity surface has a poor ability to bond to materials functioning as impurities, as compared to a nitrogen-rich surface, and has no hexagonal shape hampering the growth of crystals, thus being capable of providing light-emitting structures with a gallium nitride-based semiconductor layer having high quality crystallinity.

As apparent from the above description, in accordance with the present invention, provision of an MgN-based polarity conversion layer on the nitridated sapphire substrate enables the gallium nitride-based semiconductor layer grown in a subsequent process to grow so as to have a Ga-polarity surface. Therefore, the present invention can improve properties of the final product gallium nitride-based light-emitting device by forming light-emitting structures using the gallium nitride-based semiconductor layer having excellent crystallinity and surface properties, as compared to the conventional gallium nitride-based semiconductor layer with the N-polarity surface.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A gallium nitride-based semiconductor light-emitting device compnsing:
    a sapphire substrate having a nitridated upper surface;
    a polarity conversion layer formed on the sapphire substrate and made of MgN-based single crystals;
    a first conductive gallium nitride-based semiconductor layer formed on the polarity conversion layer;
    an active layer formed on the first conductive gallium nitride-based semiconductor layer; and
    a second conductive gallium nitride-based semiconductor layer formed on the active layer;
    wherein the polarity conversion layer is made of material satisfying a composition formula of $(Al_xGa_yIn_z)Mg_{3-(x+y+z)}N_2$ wherein $0 \leq x,y,z \leq 1$, and $0<x+y+z<3$.

2. The device as set forth in claim 1, wherein the polarity conversion layer is formed by an MBE or MOCVD method.

3. The device as set forth in claim 1, further comprising:
    a buffer layer formed between the sapphire substrate and the polarity conversion layer.

4. The device as set forth in claim 1, wherein the polarity conversion layer has a thickness of 0.001 to 0.5 μm.

5. The device as set forth in claim 1, wherein the nitridated upper surface of the a sapphire substrate comprises nitrogen dangling bonds which are bonded to Mg of said MgN-based single crystals of said polarity conversion layer.

6. A gallium nitride-based semiconductor light-emitting device compnsmg:
    a sapphire substrate having a nitridated upper surface;
    a polarity conversion layer formed on the sapphire substrate and made of MgN-based single crystals;
    a first conductive gallium nitride-based semiconductor layer formed on the polarity conversion layer;
    an active layer formed on the first conductive gallium nitride-based semiconductor layer; and
    a second conductive gallium nitride-based semiconductor layer formed on the active layer;
    wherein the polarity conversion layer is made of material satisfying a composition formula of $Si_aMg_{3-a}N_2$ wherein $0<a<1$.

7. The device as set forth in claim 6, wherein the polarity conversion layer is formed by an MBE or MOCVD method.

8. The device as set forth in claim 6, further comprising:
    a buffer layer formed between the sapphire substrate and the polarity conversion layer.

9. The device as set forth in claim 6, wherein the poiarity conversion layer has a thickness of 0.001 to 0.5 μm.

10. The device as set forth in claim 6, wherein the nitridated upper surface of the a sapphire substrate comprises nitrogen dangling bonds which are bonded to Mg of said MgN-based single crystals of said polarity conversion layer.

* * * * *